US012095356B2

United States Patent
Ma et al.

(10) Patent No.: US 12,095,356 B2
(45) Date of Patent: Sep. 17, 2024

(54) FAULT TRANSIENT FEATURES OPTIMIZATION METHOD AND SYSTEM OF AC/DC SYSTEM BASED ON DISSIPATED ENERGY

(71) Applicant: NORTH CHINA ELECTRIC POWER UNIVERSITY, Beijing (CN)

(72) Inventors: Jing Ma, Beijing (CN); Yufeng Zhao, Beijing (CN); Jialun Li, Beijing (CN); Zhencun Nie, Beijing (CN); Tong Jiang, Beijing (CN); Zengping Wang, Beijing (CN); Qixun Yang, Beijing (CN)

(73) Assignee: North China Electric Power University, Beijing (CN)

( * ) Notice: Subject to any disclaimer, the term of this patent is extended or adjusted under 35 U.S.C. 154(b) by 168 days.

(21) Appl. No.: 17/893,781

(22) Filed: Aug. 23, 2022

(65) Prior Publication Data

US 2023/0275504 A1 Aug. 31, 2023

(30) Foreign Application Priority Data

Feb. 28, 2022 (CN) .......................... 202210190459.7

(51) Int. Cl.
  *H02M 1/32* (2007.01)
  *G01R 31/40* (2020.01)
  *H02M 7/06* (2006.01)
(52) U.S. Cl.
  CPC .............. *H02M 1/32* (2013.01); *G01R 31/40* (2013.01); *H02M 7/06* (2013.01)

(58) Field of Classification Search
  CPC ............ H02M 1/32; H02M 7/06; G01R 31/40
  See application file for complete search history.

(56) References Cited

U.S. PATENT DOCUMENTS 9,287,699 B2 * 3/2016 Chen ......................... H02J 3/18
2017/0117817 A1 * 4/2017 Ahmed ..................... H02J 4/00

* cited by examiner

*Primary Examiner* — Adolf D Berhane
(74) *Attorney, Agent, or Firm* — Reising Ethington P.C.

(57) ABSTRACT

The invention relates to a fault transient features optimization method and system of AC/DC system based on dissipated energy, which belongs to the HVDC transmission technology and is used to solve the problem that the DC pulsed current is too high and the generator power angle swing of the AC system on the rectifier side is too large during the process of the HVDC transmission system restart on fault. The method includes the following steps: obtaining the output current and outlet bus voltage of the generator during the whole process of fault recovery of the AC/DC system under the current control parameters when adjusting the control parameters of the rectifier, and obtain multiple sets of control parameters and their corresponding output current and outlet bus voltage of the generator during the whole process of fault recovery of the AC/DC system; for each set of control parameters, calculating cumulative value of dynamic dissipated energy of the generator under the set of control parameters based on the output current and outlet bus voltage of the generator during the whole process of DC system fault recovery; selecting the set of control parameters that minimizes the cumulative value of dynamic dissipated energy of the generator as the optimal control parameter in the process of fault transient features optimization.

10 Claims, 13 Drawing Sheets

FAULT TRANSIENT FEATURES OPTIMIZATION METHOD AND SYSTEM OF AC/DC SYSTEM BASED ON DISSIPATED ENERGY

TECHNICAL FIELD

This invention belongs to a high voltage direct current transmission technology, in particular to a fault transient features optimization method and system of AC/DC system based on dissipated energy.

BACKGROUND

When the DC Line Protection detects a fault on the DC line, the rectifier station will enter the states of phase shift triggering and deionization, to wait for the fault to be cleared. Then, the DC restart process will be carried out by restarting the system. However, if the fault is not cleared during the process, the high DC pulsed current generated by restarting at the fault will cause a secondary impact to the system, which will cause the transient power angle of the rectifier side AC generators to swing greatly. In severe case, it may even lead to system instability.

Currently, the solutions to the above problems are mainly divided into two types:

The first type of measures uses DC current limiters or circuit breakers with current limiting capability to limit the restart DC pulsed current, thus reducing the strength of impact. A current limiter with power management capability was put forward, which can limit the fault current and control part of the power flows in AC/DC system. The superconducting fault current limiter exhibits zero resistance under steady-state operation and high resistance under fault pulsed current. Thus, the superconducting fault current limiter can limit the fault current spontaneously, which requires no need for the complicated cooperation between the control method and the relay protection. Circuit breakers with fault current limitation capability can cut off the fault current and limit the restart DC pulsed current. However, this method is difficult to be directly applied to power system due to its high cost and immature technology.

The second type of measures reduces the risk of instability during the fault process by adding control branches or regulating the control parameters to improve the transient stability of the system, and reduce the instability risk brought to the system during the fault. A nonlinear coordinated control strategy for multiple HVDC links was proposed, which can improve both the stability margin and power transfer capability of the system. Based on the Lyapunov's energy function, the operating features of the AC/DC system can be improved, and partially improved Lyapunov's functions can coordinate the power modulation of the MTDC or multiple point-to-point DC systems, which increases the domain of attraction and improves the stability margin of the generator power angle. The disadvantage of this method is that it is difficult to improve the transient features of the system greatly during restart.

SUMMARY OF THE DISCLOSURE

In view of the above analysis, the embodiment of the invention provides a fault transient features optimization method and system of AC/DC system based on dissipated energy, which can be used to optimize the transient features of the system in the process of DC restart failure, so as to solve the problem that the pulsed current in DC system is too high and the rectifier side AC system generator power angle swing is too large in the process of HVDC system restart on fault.

On the one hand, the invention discloses a fault transient features optimization method of AC/DC system based on dissipated energy, the method including the following steps:

Obtaining the output current and outlet bus voltage of the generator during the whole process of fault recovery of the AC/DC system under the current set of control parameters when every time adjusting the control parameters of the rectifier, and obtain multiple sets of control parameters and their corresponding output current and outlet bus voltage of the generator during the whole process of fault recovery of the AC/DC system.

For each set of control parameters, calculating cumulative value of dynamic dissipated energy of the generator under the set of control parameters based on the output current and outlet bus voltage of the generator during the whole process of DC system fault recovery under the set of control parameters.

Selecting the set of control parameters that minimizes the cumulative value of dynamic dissipated energy of the generator as optimal control parameters in the process of fault transient features optimization.

On the basis of the above scheme, the invention makes the following improvements:

Further, the cumulative value of dynamic dissipated energy of the generator under the set of control parameters is obtained by performing the following operations:

Obtaining every commutation interval of Y/D bridge of inverter in the whole process of AC/DC system fault recovery under the set of control parameters.

Separately calculating the dynamic dissipated energy of the generator in each commutation interval.

Accumulating the dynamic dissipated energy of the generator in all commutation intervals and obtaining the cumulative value of dynamic dissipated energy of the generator under the set of control parameters.

Further, the rectifier adopts a constant current control mode.

Further, the cumulative value of dynamic dissipated energy of the generator $W_\Sigma$ is:

$$W_\Sigma = \Sigma W_{G(n)}(K_r, T_r, t_{P2Y}, t_{P2\Delta}) \quad (1)$$

Where, $W_{G(n)}$ represents the dynamic dissipated energy of the generator in the $n_{th}$ commutation interval; $K_r$, $T_r$ is the control parameter of the rectifier in constant current control mode, where $K_r$ is proportional coefficient of PI unit, $T_r$ is the time constant of PI unit; $t_{P2Y}$ and $t_{P2\Delta}$ respectively represent start time and end time of the commutation interval of Y/D bridge of inverter.

Further, the dynamic dissipated energy of the generator $W_G$ is:

$$W_G = \int i_{dG} du_{qG} - \int i_{qG} du_{dG} + \int (u_{dG} i_{dG} + u_{qG} i_{qG}) d\theta \quad (2)$$

Where $i_{dG}$ and $i_{qG}$ respectively represent components of the output current of the generator in axis d and axis q; $u_{dG}$ and $u_{qG}$ respectively represent components of generator outlet bus voltage on axis d and q, and $\theta$ is the included angle between axis q and axis x.

On the other hand, the invention also discloses a fault transient features optimization system of AC/DC system based on dissipated energy, including:

A data acquisition module is configured to obtain the output current and outlet bus voltage of the generator during the whole process of fault recovery of the AC/DC system under the current set of control parameters when adjusting the control parameters of the rectifier, and obtain multiple sets of control parameters and their corresponding output current and outlet bus voltage of the generator during the whole process of fault recovery of the AC/DC systems;

A cumulative value of dynamic dissipated energy acquisition module is configured to, for each set of control parameters, calculate the cumulative value of dynamic dissipated energy of the generator under the set of control parameters based on the output current and outlet bus voltage of the generator during the whole process of DC system fault recovery under the set of control parameters.

An optimized control parameter acquisition module is configured to select the set of control parameters that minimizes the cumulative value of dynamic dissipated energy of the generator as optimal control parameters in the process of fault transient features optimization.

On the basis of the above scheme, the invention also makes the following improvements:

Further, the cumulative value of dynamic dissipated energy of the generator under the set of control parameters is obtained by performing the following operations:

Obtaining every commutation interval of Y/D bridge in the whole process of AC/DC system fault recovery under the set of control parameters.

Separately calculating the dynamic dissipated energy of the generator in each commutation interval.

Accumulating the dynamic dissipated energy of the generator in all commutation intervals and obtaining the cumulative value of dynamic dissipated energy of the generator under the set of control parameters.

Further, the rectifier adopts a constant current control mode.

Further, the cumulative value of dynamic dissipated energy of the generator $W_\Sigma$ is:

$$W_\Sigma = \Sigma W_{G(n)}(K_r, T_r, t_{P2Y}, t_{P2\Delta}) \quad (3)$$

Where, $W_{G(n)}$ represents the dynamic dissipated energy of the generator in the $n_{th}$ commutation interval; $K_r$, $T_r$ is the control parameter of the rectifier in constant current control mode, where $K_r$ is proportional coefficient of PI unit, $T_r$ is the time constant of PI unit; $t_{P2Y}$ and $t_{P2\Delta}$ respectively represent start time and end time of the commutation interval of Y/D bridge of inverter.

Further, the dynamic dissipated energy of the generator $W_G$ is:

$$W_G = \int i_{dG} du_{qG} - \int i_{qG} du_{dG} + \int (u_{dG} i_{DG} + u_{qG} i_{qG}) d\theta \quad (4)$$

Where, $i_{dG}$ and $i_{qG}$ respectively represent components of the output current of the generator in axis d and axis q; $u_{dG}$ and $u_{qG}$ respectively represent the components of generator outlet bus voltage on axis d and q, and $\theta$ is the included angle between axis q and axis x.

The fault transient features optimization method and system of AC/DC system based on dissipated energy provided by the invention have the following advantages:

The topology change of the rectifier during the restart process is considered in detail, which can realize the analysis of the impact of the converter conduction topology change on the system during the restart failure process, and realize the optimization of the transient features of the AC/DC hybrid system during the restart process.

It well solves the problems that the pulsed current of the DC system is too high and the power angle swing of the AC system generator on the rectifier side is too large during the restart failure of the HVDC transmission system.

In the invention, the above technical schemes can also be combined with each other to realize more optimal combination schemes. Other features and advantages of the invention will be described in a subsequent specification, and some of the advantages may become apparent from the specification or be known by the implementation of the invention. The purpose and other advantages of the invention can be realized and obtained from the contents specially indicated in the specification and appended drawings.

BRIEF DESCRIPTION OF THE DRAWINGS

The drawings are only for the purpose of showing specific embodiments and are not considered to be a limitation of the disclosure. Throughout the drawings, the same reference symbols represent the same components.

DETAILED DESCRIPTION OF EMBODIMENTS

The preferred embodiments of the present disclosure are described in detail with reference to the attached drawings. The accompanying drawings form a part of the present application and are used together with embodiments of the present disclosure to explain the principles of the disclosure and are not intended to limit the scope of the disclosure.

Embodiment 1

Figure 1:
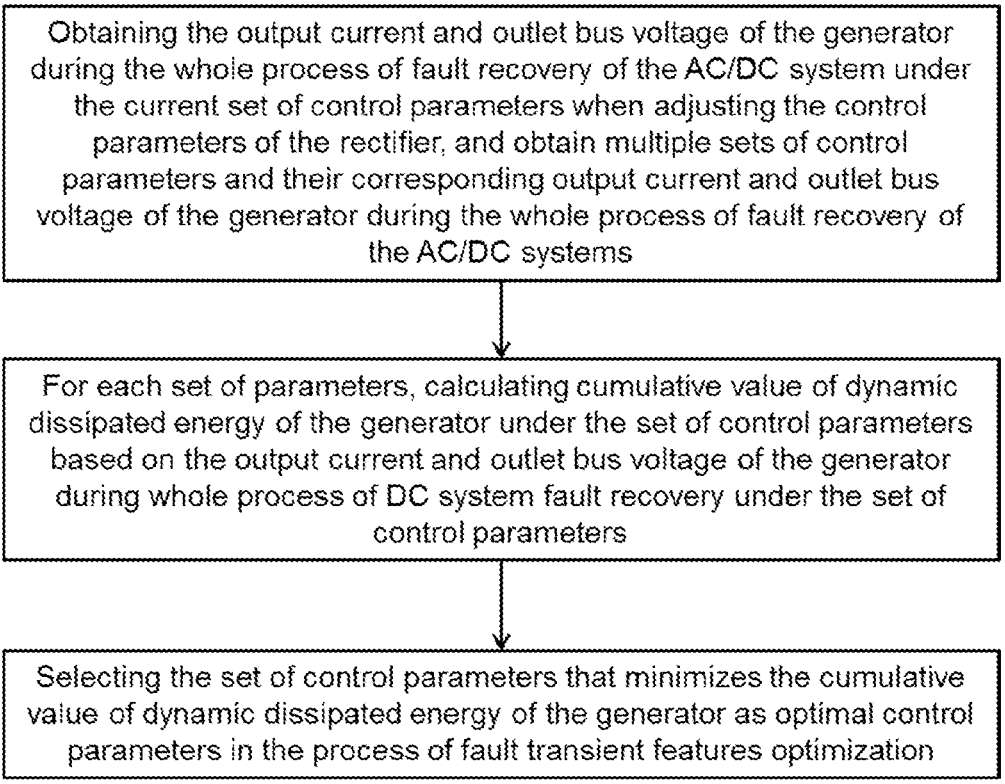
FIG. 1 is the flow chart of fault transient features optimization method of AC/DC system based on dissipated energy.

A specific embodiment of the invention discloses a fault transient features optimization method of AC/DC system based on dissipated energy. The flow chart is shown in FIG. 1, including the following steps:

Step S1: Obtaining the output current and outlet bus voltage of the generator during the whole process of fault recovery of the AC/DC system under the current set of control parameters when every time adjusting the control parameters of the rectifier, and obtain multiple sets of control parameters and their corresponding output current and outlet bus voltage of the generator during the whole process of fault recovery of the AC/DC system.

Step S2: for each set of control parameters, calculating the cumulative value of dynamic dissipated energy of the generator under the set of control parameters based on the output current and outlet bus voltage of the generator during the whole process of DC system fault recovery under the set of control parameters.

Step S3: selecting the set of control parameters that minimizes the cumulative value of dynamic dissipated energy of the generator as optimal control parameters in the process of fault transient features optimization.

Compared with the prior art, the fault transient features optimization method of AC/DC system based on dissipated energy provided in this embodiment, the topology change of the rectifier in the restart process is considered in detail to realize the analysis of the impact of the converter conduction topology change on the system in the restart failure process, and the optimization of the transient features of the AC/DC hybrid system in the restart process. The problem that the DC system pulsed current is too high and the power angle swing of the AC system generator on the rectifier side is too large in the process of the restart failure of the HVDC transmission system is well solved.

Preferably, in this embodiment, the cumulative value of dynamic dissipated energy of the generator under the set of control parameter is obtained by performing the following operations:

Obtaining every commutation interval of Y/D bridge of inverter in the whole process of AC/DC system fault recovery under the set of control parameters.

Separately calculating dynamic dissipated energy of the generator in each commutation interval.

Accumulating the dynamic dissipated energy of the generator in all commutation intervals and obtaining the cumulative value of dynamic dissipated energy of the generator under the set of control parameters.

Specifically, the rectifier adopts a constant current control mode. At this point, the cumulative value of dynamic dissipated energy of the generator $W_\Sigma$ is:

$$W_\Sigma = \Sigma W_{G(n)}(K_r, T_r, t_{P2Y}, t_{P2\Delta})$$

Where, $W_{G(n)}$ represents the dynamic dissipated energy of the generator in the nth commutation interval; $K_r$, $T_r$ is the control parameter of the rectifier in constant current control mode, where $K_r$ is proportional coefficient of PI unit, $T_r$ is time constant of PI unit; $t_{P2Y}$ and $t_{P2\Delta}$ respectively represent start time and end time of the commutation interval of Y/D bridge of inverter.

The dynamic dissipated energy of the generator $W_G$ is:

$$W_G = \int i_{dG} du_{qG} - \int i_{qG} du_{dG} + \int (u_{dG} i_{dG} + u_{qG} i_{qG}) d\theta$$

Where, $i_{dG}$ and $i_{qG}$ respectively represent components of the output current of the generator in axis d and axis q; $u_{dG}$ and $u_{qG}$ respectively represent components of generator outlet bus voltage in axis d and axis q.

In order to facilitate the person skilled in the art to better understand the implementation process of this embodiment, the scheme of this embodiment is introduced as follows:

Step 1. Considering the influence of phase shift triggering, deionization and restart stages in the whole transient process of the fault recovery stage on the generator, the dissipated energy model of the generator injection system including the rectifier control parameters is established.

In this embodiment, considering the influence of phase shift triggering, deionization and restart stages on the generator during the whole transient process of fault recovery stage, the dissipated energy model of generator injection system including rectifier control parameters is established.

Figure 2:
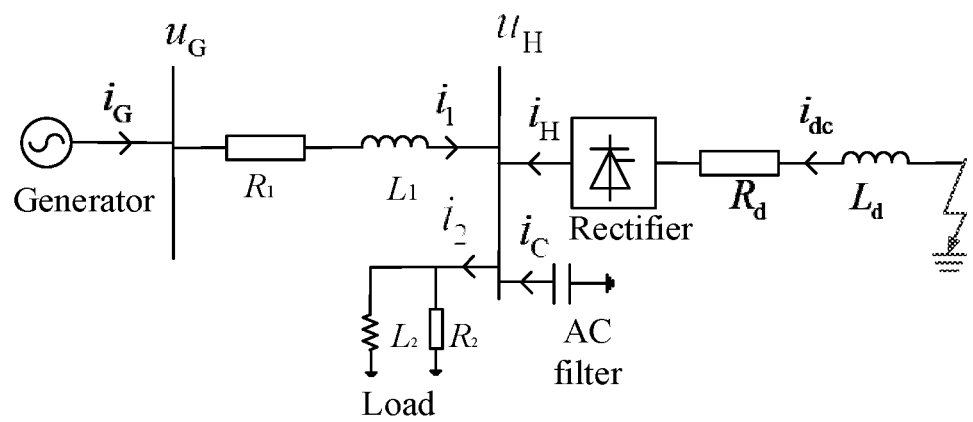
FIG. 2 is the schematic diagram of HVDC rectifier side AC system.

The diagram of the rectifier side of AC/DC system ("AC/DC hybrid system") is shown in FIG. 2, where $u_H$ is the voltage at the rectifier-side converter bus; $u_G$ is the voltage at the generator outlet bus; $i_{dc}$ is the DC current flowing through the DC line on the rectifier side; $i_H$ is the current injected from the inverter into the AC system; $i_C$ is the current flowing through the AC filter; $i_1$ is the current on the AC line; $i_2$ is the load current; $i_G$ is the generator output current; $R_1$ and $L_1$ represent the resistance and inductance of the AC line respectively. $R_d$ and $L_d$ represent the resistance and inductance of the DC line respectively. $R_2$ and $L_2$ represent the resistance and inductance of constant impedance loads respectively.

Figure 3:
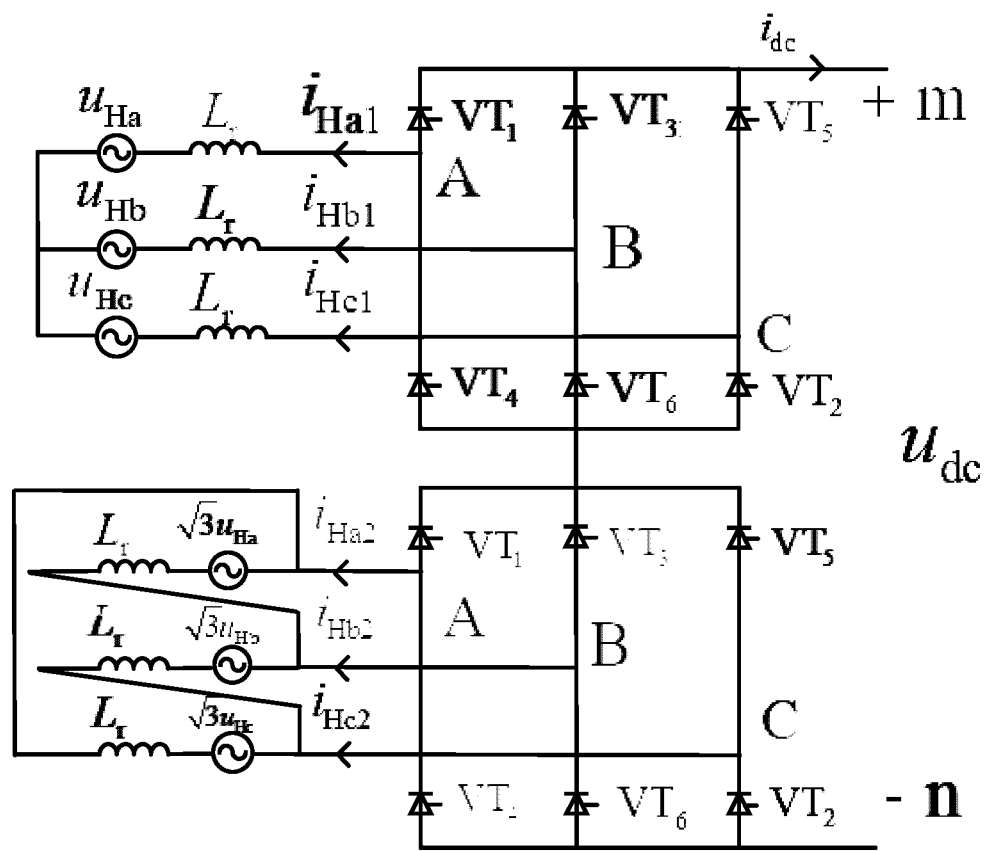
FIG. 3 is the rectifier side converter wiring diagram.

The wiring diagram of rectifier side converter is shown in FIG. 3. In FIG. 3, $u_{dc}$ represents the DC voltage of the DC line on the rectifier side; $L_r$ represents the equivalent inductance of the converter transformer; $u_{Ha}$, $u_{Hb}$, $u_{Hc}$ represent the three-phase voltage of the converter bus on the rectifier side; $i_{Ha}$, $i_{Hb}$, $i_{Hc}$ represent the three-phase current injected by the rectifier into the AC system. m and n are the common cathode and common anode points of the rectifier respectively. VT1~VT6 represent the first to sixth valve arms of the rectifier; Subscripts 1 and 2 denote Y bridge and D bridge respectively.

In DC system, the whole fault recovery process contains three stages: 'phase shift triggering', 'deionization' and 'restart'. When a DC line fault is detected, the rectifier side will enter the 'phase shift triggering' stage first. In this stage, the control system will adjust the rectifier-side firing angle to 120°, so that the rectifier will turn to the inverter-operation-state and the fault current ($i_{dc}$) will quickly drop to 0. After the phase shifting, the firing angle of the rectifier station will be adjusted to 160°, so that the rectifier valves will stop commutating and the DC system will enter the 'deionization' stage to wait for the fault arc to be extinguished. After the deionization stage is completed, the control system will restore the real-time firing angle of the rectifier side to the initial angle (17° in the example system) and try to restart. If the fault is not cleared, restarting on the fault will lead to a high restart DC pulsed current, which will cause the DC protection to operate again, and then the above fault recovery process will repeat again. Since the switching of the rectifier operation mode in the above process, the traditional quasi-steady-state mean value model cannot depict the dynamic fault recovery process in details. This embodiment uses the detailed model of the rectifier shown in FIG. 3 to analyze the transient electrical variables.

During the DC phase shifting and restart process, the rectifier can commutate and conduct according to the normal trigger sequence; during the deionization process, the commutator valve maintains its conducting state and stops commutation. Thus, for the AC line and constant impedance load where the inductor L1 is located, there are:

$$\begin{cases} u_{Ga} = u_{Ha} + R_1 i_{1a} + L_1 \dfrac{di_{1a}}{dt} \\ u_{Gb} = u_{Hb} + R_1 i_{1b} + L_1 \dfrac{di_{1b}}{dt} \\ u_{Gc} = u_{Hc} + R_1 i_{1c} + L_1 \dfrac{di_{1c}}{dt} \\ u_{Ha} + \dfrac{L_2}{R_2} \dfrac{du_{Ha}}{dt} = L_2 + \dfrac{di_{2a}}{dt} \\ u_{Hb} + \dfrac{L_2}{R_2} \dfrac{du_{Hb}}{dt} = L_2 + \dfrac{di_{2b}}{dt} \\ u_{Hc} + \dfrac{L_2}{R_2} \dfrac{du_{Hc}}{dt} = L_2 + \dfrac{di_{2c}}{dt} \end{cases} \quad (1)$$

Concerning the DC line, there are:

$$u_{dc} = R_d i_{dc} + L_d \frac{di_{dc}}{dt} \quad (2)$$

Concerning the AC filter, there are:

$$i_c = \frac{u_c}{R} e^{-\frac{t}{R_c C}} \quad (3)$$

Concerning the 12-pulse rectifier, suppose Y bridge $VT_1$, $VT_2$ and D bridge $VT_1$, $VT_6$ are turned on:

$$\begin{cases} u_{dc} = -u_{Hca} + \sqrt{3} u_{Ho} - \frac{8}{3} L_r \frac{di_{dc}}{dt} \\ i_{Ha} = -\left(1 + \frac{2}{\sqrt{3}}\right) i_{dc} \\ i_{Hb} = \frac{1}{\sqrt{3}} i_{dc} \\ i_{Hc} = \left(1 + \frac{1}{\sqrt{3}}\right) i_{dc} \end{cases} \quad (4)$$

Concerning the rectifier-side converter bus in the 'restart' stage:

$$\begin{cases} i_{2a} - i_{Ha} - i_{Ca} = i_{1a} \\ i_{2b} - i_{Hb} - i_{Cb} = i_{1b} \\ i_{2c} - i_{Hc} - i_{Cc} = i_{1c} \end{cases} \quad (5)$$

Concerning the generator outlet bus:

$$\begin{cases} i_{Ga} = i_{1a} \\ i_{Gb} = i_{1b} \\ i_{Gc} = i_{1c} \end{cases} \quad (6)$$

Figure 4:
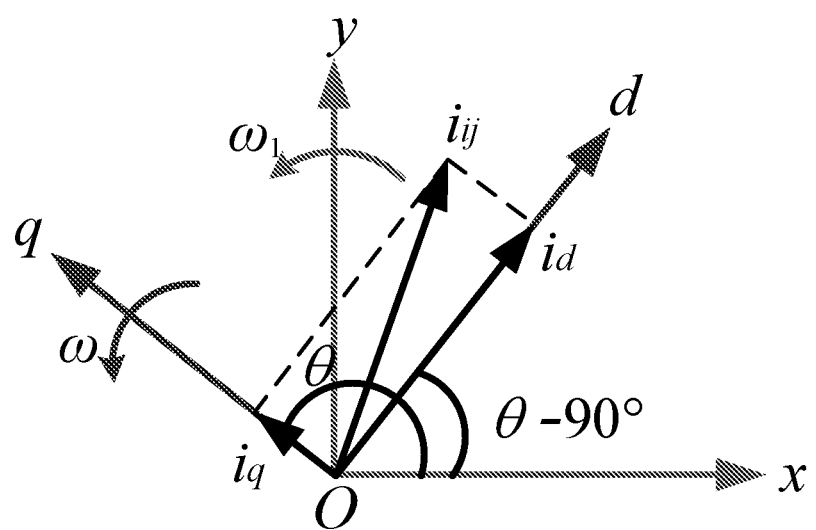
FIG. 4 is the schematic diagram of dq coordinates and xy coordinates.

In power system, the node current equation can be used to construct the dissipated energy function. The equivalent node current equation of the AC/DC system can be expressed as:

$$I_{in} = YU_B - I_G + I_L \quad (7)$$

where Y is the admittance matrix of the system; $U_B$ is the column vector of bus voltages; $I_G$ and $I_L$ are the column vectors of injection currents at generator nodes and load nodes. Integrating the imaginary part $i^*_{ij}$ of the injection currents at generator nodes $I_G$ yields the dynamic dissipated energy of all generator injected to system:

$$\begin{aligned} W &= \int \mathrm{Im}\left(i^*_{ij} du_i\right) \quad (8) \\ &= \int \mathrm{Im}\left((i_{ij,x} - ji_{ij,y})(du_{ij,x} + jdu_{ij,y})\right) \\ &= \int (\Delta i_{ij,x} du_{i,jy} - \Delta i_{ij,y} du_{ij,x}) \end{aligned}$$

where $i_{ij}$ the current on the branch $L_{ij}$, which is connected with generator node i; $u_i$ is the voltage at node i; subscripts x and y represent the variables in xy coordinate system. The relationship between the xy coordinate system and the dq coordinate system is shown in FIG. 4. The xy coordinate system rotates at the system synchronous angular speed $\omega_1$, and the dq coordinate system rotates in angular speed $\omega$, with an angle difference of $\theta$ between q axis and x axis.

According to FIG. 4, $i_{ij}$ can be expressed as:

$$\begin{aligned} i_{ij} &= i_d \cos(\theta - 90°) + ji_d \sin(\theta - 90°) \quad (9) \\ &= i_q \cos\theta + ji_q \sin\theta \\ &= (i_d \sin\theta + i_q \cos\theta) + j(i_q \sin\theta - i_d \cos\theta) \end{aligned}$$

Similarly:

$$u_{ij} = (u_d \sin\theta + u_q \cos\theta) + j(u_q \sin\theta - u_d \cos\theta) \quad (10)$$

In equations (9) and (10), subscripts d and q represent the variables in dq coordinate system. By applying equations (9) and (10) to equation (8), the expression of the dynamic dissipated energy injected from the generator to the system can be obtained:

$$W = \int i_d du_q - \int i_q du_d + \int (u_d i_d + u_q i_q) d\theta \quad (11)$$

The AC/DC system rectifier-side system includes the generator, AC lines, loads, DC terminal and AC filters, thus according to (7) and the conservation law of energy:

$$W_G = \int i_{dG} du_{qG} - \int i_{qG} du_{dG} + \int (u_{dG} i_{dG} + u_{qG} q G d\theta = W_{HVDC} + W_{Ln} + W_L + W_C \quad (12)$$

Where, $W_{HVDC}$, $W_{Ln}$, $W_C$ and $W_G$ are the dynamic dissipated energy of DC terminals, AC lines, loads, AC filters, and generator under AC/DC systems.

By combining equations (1)-(6), the voltage and current at the generator terminal can be calculated. Apply Park transformation to the voltage and current and then apply the results to equation (12), so that the dynamic dissipated energy injected from the generator to the system under the above conducting topology of the rectifier can be obtained:

$$W_G = \int \left\{ \begin{array}{c} \frac{-\lambda U_m^2}{L_1} \cdot \frac{e^{2\lambda t}}{\omega^2 + \left(\lambda + \frac{R_1}{L_1}\right)^2} \cdot \left[ -\left(1 + \frac{K_1}{K_2} + \frac{K_3}{K_4}\right)\omega + \left(\frac{1}{K_2 + \frac{1}{K_4}}\right)\omega\left(\lambda + \frac{R_1}{L_1}\right) \right] \\ -\lambda e^{\left(\lambda \frac{R_1}{L_1}\right)t} U_m \left[ C_1 \cos\omega t + \frac{\sqrt{3}}{3}(C_2 - C_3)\sin\omega t \right] \end{array} \right\} dt + \quad (13)$$

$$\int \left\{ \begin{array}{c} \frac{U_m^2}{L_1} \cdot \frac{e^{2\lambda t}}{\omega^2 + \left(\lambda + \frac{R_1}{L_1}\right)^2} \cdot \left[ \left(1 + \frac{K_1}{K_2} + \frac{K_3}{K_4}\right)\left(\lambda + \frac{R_1}{L_1}\right) + \omega^2\left(\frac{1}{K_2} + \frac{1}{K_4}\right) \right] \\ + e^{\left(\lambda \frac{R_1}{L_1}\right)t} U_m \left[ C_1 \sin\omega t + \frac{\sqrt{3}}{3}(C_2 - C_3)\cos\omega t \right] \end{array} \right\} (\omega - \omega_1) dt$$

Where, $U_m$ is the amplitude of generator outlet bus voltage; $\lambda$ is the increasing coefficient of the voltage amplitude (generator actual outlet bus voltage divided by $U_m$); $\omega$ is the rated speed of the generator; $\omega_i$ is the actual speed of the generator; $C_1$, $C_2$ and $C_3$ are constants generated in the integration operation. The specific expressions of other coefficients are as follows:

$$K_1 = \frac{a_1}{2} + \frac{d_4}{2} - \lambda + \frac{\sqrt{a_1^2 + d_4^2 + 4a_4 d_1 - 2a_1 d_4}}{2},$$

-continued $$K_3 = \frac{a_1}{2} + \frac{d_4}{2} - \lambda + \frac{\sqrt{a_1^2 + d_4^2 + 4a_4d_1 - 2a_1d_4}}{2}$$

$$K_2 = \sqrt{a_1^2 + d_4^2 + 4a_4d_1 - 2a_1d_4} \cdot \left(a_1 - d_4 + \frac{\sqrt{a_1^2 + d_4^2 + 4a_4d_1 - 2a_1d_4}}{2d_1}\right) \cdot$$

$$\begin{bmatrix} (2a_4d_1 - 2a_1\lambda - 2d_4\lambda) \\ +(a_1 + d_4 - 2\lambda)\sqrt{a_1^2 + d_4^2 + 4a_4d_1 - 2a_1d_4} \\ +(a_1^2 + d_4^2 + 2\lambda^2 + 2\omega^2) \end{bmatrix},$$

$$K_4 = \sqrt{a_1^2 + d_4^2 + 4a_4d_1 - 2a_1d_4} \cdot \left(d_4 - a_1 + \frac{\sqrt{a_1^2 + d_4^2 + 4a_4d_1 - 2a_1d_4}}{2d_1}\right) \cdot$$

$$\begin{bmatrix} (2a_4d_1 - 2a_1\lambda - 2d_4\lambda) \\ -(a_1 + d_4 - 2\lambda)\sqrt{a_1^2 + d_4^2 + 4a_4d_1 - 2a_1d_4} \\ +(a_1^2 + d_4^2 + 2\lambda^2 + 2\omega^2) \end{bmatrix},$$

$$a_1 = \left[-\left(\frac{R_1 + R_2}{L_1}\right) - \frac{\left(3 + \frac{5}{3}\sqrt{3}\right)R_2}{L_d + \frac{8}{3}L_r} - Ce^{-\frac{t}{R_cC}}\right]$$

$$a_4 = \left[-\left(1 + \frac{2}{\sqrt{3}}\frac{R_1R_2}{L_1} + \frac{\left(1 + \frac{2}{\sqrt{3}}\right)R_2R_d}{L_d + \frac{8}{3}L_r} + Ce^{-\frac{t}{R_cC}}\right)\right],$$

$$d_1 = \frac{\sqrt{3} + 1}{L_d + \frac{8}{3}L_r},$$

$$d_4 = \frac{R_d}{L_d + \frac{8}{3}L_r}.$$

Where, C is the equivalent capacitance of the AC filter, and $R_c$ is the equivalent resistance of the AC filter.

Due to the symmetry of the rectifier's conduction topology, the expression of the generator's dynamic dissipated energy under different conduction states is consistent with the form of equation (13).

Step 2: calculate the cumulative value of dynamic dissipated energy during the whole process of AC/DC system fault recovery.

Figure 5:
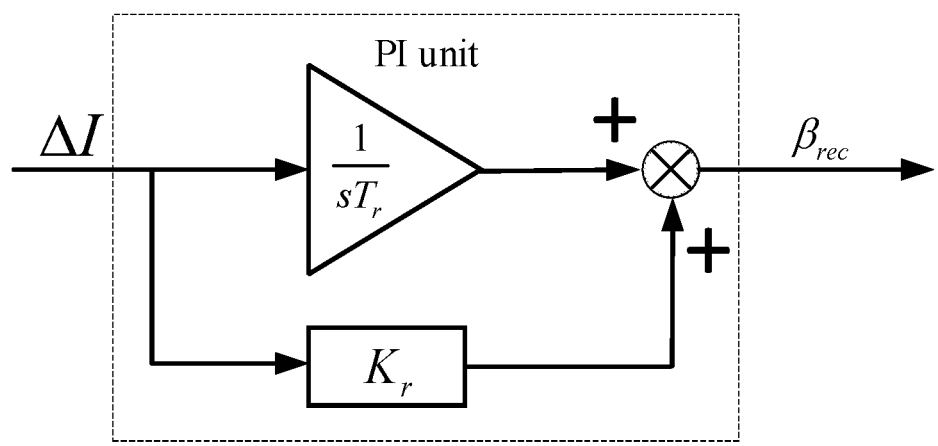
FIG. 5 is the diagram of constant current control on rectifier side.

Taking the Cigre HVDC transmission model as an example. Its rectifier adopts constant current control, and its control block diagram is shown in FIG. 5. The rectifier-side constant current controller applies PI control, and its output is the firing advance angle $\beta_{rec}$, which has the following relationship with the firing angle $\alpha_{rec}$: $\beta_{rec}=\pi-\alpha_{rec}$.

The control equation of the rectifier is:

$$\alpha_{rec}(t) = \pi - K_r[I_{d\_ref} - i_{dc}(t)] - \frac{1}{T_r}[I_{d\_ref} - i_{dc}(t)]dt \quad (14)$$

Where, $\alpha_{rec}$ is the firing angle of the rectifier; $I_{d\_ref}$ is the reference value of rectifier-side DC current; $i_{dc}$ is the measured value of DC current; $K_r$ and $T_r$ are the PI parameters of rectifier-side constant current controller.

Figure 6:
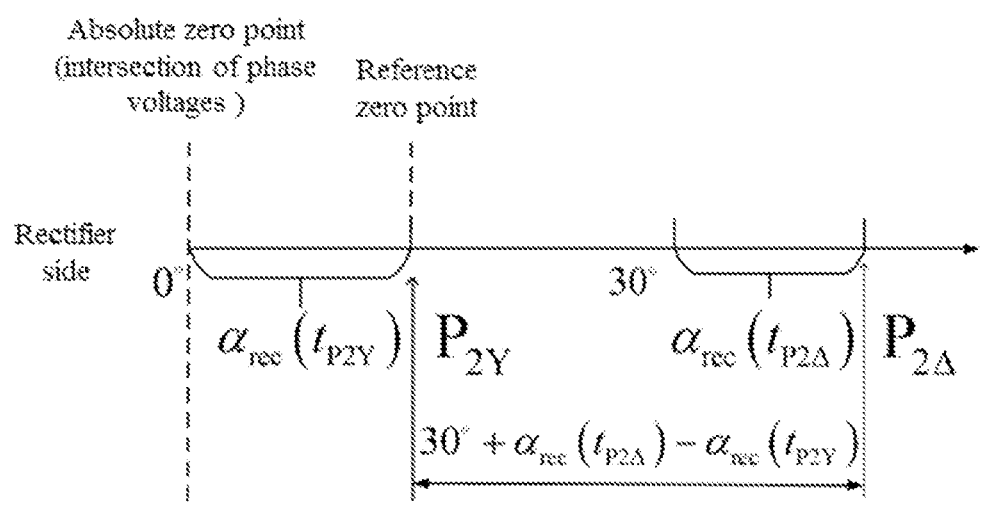
FIG. 6 is the influence of firing angle on commutation interval.

The intersection of phase voltages is taken as the absolute zero point, and taking the trigger pulse of TV2 in one cycle as the reference zero point, which is shown in FIG. 6, where t represents time; $P_{2Y}$ and $P_{2\Delta}$ are the trigger pulses of the VT2 thyristors of the rectifier Y bridge and D bridge respectively.

In normal operation state, the firing angles at $t_{P2Y}$ and $t_{P2\Delta}$ are the same, i.e. $\alpha(t_{P2Y})=\alpha(t_{P2\Delta})$. Thus, the angle difference between $P_{2Y}$ and $P_{2\Delta}$ is 30°, and the 1st commutation interval in one cycle period is $$\left[0, \frac{30°}{\omega_1}\right]$$

(with $P_{2Y}$ as the reference zero point). When a fault occurs on the DC line, affected by the constant current control, $\alpha(t_{P2Y})\neq\alpha(t_{P2\Delta})$. Thus, the angle difference between $P_{2Y}$ and $P_{2\Delta}$ will be $30°+\alpha_{rec}(t_{P2\Delta})-\alpha_{rec}(t_{P2Y})$, and the 1st turn-on interval will become $$\left[0, \frac{30° + \alpha_{rec}(t_{P2\Delta}) - \alpha_{rec}(t_{P2Y})}{\omega}\right].$$

According to equation (14), the rectifier firing angle $\alpha_{rec}$ is a function of t. Hence, the expressions of $\alpha_{rec}(t)$ in different turn-on interval of the converter valves are different. When VT1 and VT2 of Y bridge and VT1 and VT6 of D bridge are turned on, the turn-on interval is calculated as follows. Suppose this interval starts from $t_{P2Y}$ and ends at $t_{P2\Delta}$, thus, the firing angles at $t_{P2Y}$ and $t_{P2\Delta}$ are:

$$\alpha_{rec}(t_{P2Y}) = \pi - K_r[I_{d\_ref} - i_{dc}(t_{P2Y})] - \frac{1}{T_r}\int_{t_{P2Y}}^{t_{P2Y}}[I_{d\_ref} - i_{dc}(t)]dt \quad (15)$$

$$\alpha_{rec}(t_{P2\Delta}) = \pi - K_r[I_{d\_ref} - i_{dc}(t_{P2\Delta})] - \frac{1}{T_r}\int_{t_{P2Y}}^{t_{P2\Delta}}[I_{d\_ref} - i_{dc}(t)]dt \quad (16)$$

The time length corresponding to this turn-on interval is:

$$\frac{30° + \alpha_{rec}(t_{P2\Delta}) - \alpha_{rec}(t_{P2Y})}{\omega} = \quad (17)$$

$$\frac{1}{\omega} \cdot \left\{30° + K_r[i_{dc}(t_{P2\Delta}) - i_{dc}(t_{P2Y})] - \frac{1}{T_r}\int_{t_{P2Y}}^{t_{P2\Delta}}[I_{d\_ref} - i_{dc}(t)]dt\right\}$$

Equation (17) is denoted as $\varphi(K_r, T_r)$, a function of $K_r$ and $T_r$.

In equation (17), the expressions of $i_{dc}(t)$, $t_{P2Y}$ and $t_{P2\Delta}$ are to be determined. By combining equations (1)-(6), the expression of DC current $i_{dc}$ in this commutation interval can be obtained:

$$i_{dc} = \frac{A_1 U_m}{L_d + \frac{8}{3}L_r} \cdot \quad (18)$$

$$\frac{e^{\lambda t}}{\omega^2 + \left(\frac{R_d}{L_d + \frac{8}{3}L_r}\right)^2} \left\{\begin{bmatrix} \left(\lambda + \frac{R_d}{L_d + \frac{8}{3}L_r}\right)\sin\omega t - \omega\cos\omega t \end{bmatrix} \cdot \\ \begin{bmatrix} \left(\frac{3}{2} + \sqrt{3}\right)\cos\varphi_H + \frac{\sqrt{3}}{2}\sin\varphi_H \end{bmatrix} \\ + \left[\omega\sin\omega t + \left(\lambda + \frac{R_d}{L_d} + \frac{8}{3}L_r\right)\cos\omega t\right] \cdot \\ \begin{bmatrix} \left(\frac{3}{2} + \sqrt{3}\right)\sin\varphi_H - \frac{\sqrt{3}}{2}\cos\varphi_H \end{bmatrix} \end{bmatrix}\right\} +$$

-continued

Where, $A_1 = -\sqrt{\omega^2\left(\frac{1}{K_2}+\frac{1}{K_4}\right)^2 + \left(\frac{K_1}{K_2}+\frac{K_3}{K_4}\right)^2}$, $C_4 e^{\frac{R_d}{L_a+\frac{8}{3}L_r}t}$ $\varphi_H = \arctan^{-1}\left(\frac{\omega\left(\frac{1}{K_2}+\frac{1}{K_4}\right)}{\left(\frac{K_1}{K_2}+\frac{K_3}{K_4}\right)}\right)$;

Where $C_4$ is a constant generated during the integration operation. The relationship between the turn-on moments ($t_{P2Y}$ and $t_{P2\Delta}$) and the corresponding firing angles ($\alpha_{rec}$ ($t_{P2Y}$) and $\alpha_{rec}(t_{P2\Delta})$) is:

$$t_{P2Y} = \frac{0° + \alpha_{rec}(t_{P2Y})}{\omega} \quad (19)$$

$$t_{P2\Delta} = \frac{30° + \alpha_{rec}(t_{P2\Delta})}{\omega} \quad (20)$$

According to equations (14), (15) and (18)-(20), $t_{P2Y}$, $t_{P2\Delta}$ and rectifier control parameters $K_r$ and $T_r$ form a transcendental equation containing implicit functions. Combining equation (17), the cumulative value of dissipated energy of the generator in the whole process of fault recovery' can be expressed as:

$$W_\Sigma = \Sigma W_{G(n)}(K_r, T_r, t_{P2Y}, t_{P2\Delta}) \quad (21)$$

Where-n represents the nth turn-on interval.

Step 3: To minimize the cumulative value of dissipated energy, solve the optimal control parameters of the rectifier and output them.

In order to reduce the impact of the dissipated energy on the sending-end system, $W_\Sigma$ should be made as small as possible. Denote the integrand function of $W_G$ in the nth turn-on interval as $f_n(t)$, and the upper and lower limits of the integration in the nth turn-on interval as $\varphi_n(K_r, T_r)$ and $\varphi_{n+1}(K_r, T_r)$. By combining equations (16) and (21), the partial derivative expressions of the cumulative value $W_\Sigma$ of the total system energy during the fault recovery period to $K_r$ and $T_r$ can be calculated:

$$\frac{\partial W_\Sigma}{\partial K_r} = \sum \frac{\partial W_{G(n)}}{\partial K_r} = \quad (22)$$

$$\sum \left\{ f_n[\varphi_{n+1}(K_r, T_r)] \cdot \frac{\partial \varphi_{n+1}(K_r, T_r)}{\partial K_r} - f_n(\varphi_n(K_r, T_r)) \cdot \frac{\partial \varphi_{n+1}(K_r, T_r)}{\partial K_r} \right\}$$

$$\frac{\partial W_\Sigma}{\partial T_r} = \sum \frac{\partial W_{G(n)}}{\partial T_r} = \quad (23)$$

$$\sum \left\{ f_n[\varphi_{n+1}(K_r, T_r)] \cdot \frac{\partial \varphi_{n+1}(K_r, T_r)}{\partial K_r} - f_n(\varphi_n(K_r, T_r)) \cdot \frac{\partial \varphi_{n+1}(K_r, T_r)}{\partial K_r} \right\}$$

According to equations (22) and (23), the conditions under which $W_\Sigma$ reaches the extreme values are:

$$\sum \left\{ f_n[\varphi_{n+1}(K_r, T_r)] \cdot \frac{\partial \varphi_{n+1}(K_r, T_r)}{\partial K_r} - f_n(\varphi_n(K_r, T_r)) \cdot \frac{\partial \varphi_n(K_r, T_r)}{\partial K_r} \right\} = 0 \quad (24)$$

$$\sum \left\{ f_n[\varphi_{n+1}(K_r, T_r)] \cdot \frac{\partial \varphi_{n+1}(K_r, T_r)}{\partial K_r} - f_n(\varphi_n(K_r, T_r)) \cdot \frac{\partial \varphi_{n+1}(K_r, T_r)}{\partial K_r} \right\} \quad (25)$$

When VT1 and VT2 of Y bridge and VT1 and VT6 of D bridge are turned on, $f_n[\varphi_{n+1}(K_r, T_r)]$ can be further expanded as $$f_n[\varphi_{n+1}(K_r, T_r)] = \quad (26)$$

$$\int \left\{ \begin{array}{l} \left\{ \frac{-\lambda U_m^2}{L_1} \cdot \frac{e^{2\lambda t}}{\omega^2 + \left(\lambda+\frac{R_1}{L_1}\right)^2} \cdot \left[-\left(1+\frac{K_1}{K_2}+\frac{K_3}{K_4}\right)\omega + \right.\right. \\ \left.\left. \left(\frac{1}{K_2+\frac{1}{K_4}}\right)\omega\left(\lambda+\frac{R_1}{L_1}\right)\right] \right\} \\ -\lambda e^{\left(\lambda\frac{R_1}{L_1}\right)t} U_m\left[C_1\cos\omega t + \frac{\sqrt{3}}{3}(C_2-C_3)\sin\omega t\right] \end{array} \right\} dt +$$

$$\int \left\{ \begin{array}{l} \frac{U_m^2}{L_1} \cdot \frac{e^{2\lambda t}}{\omega^2 + \left(\lambda+\frac{R_1}{L_1}\right)^2} \cdot \left[\left(1+\frac{K_1}{K_2}+\frac{K_3}{K_4}\right)\left(\lambda+\frac{R_1}{L_1}\right)+ \right. \\ \left. \omega^2\left(\frac{1}{K_2}+\frac{1}{K_4}\right)\right] \\ +e^{\left(\lambda\frac{R_1}{L_1}\right)t} U_m\left[C_1\sin\omega t + \frac{\sqrt{3}}{3}(C_2-C_3)\cos\omega t\right] \end{array} \right\}(\omega-\omega_1)dt$$

Where, $$t = \frac{1}{\omega} \cdot \left\{ 30° + K_r[i_{dc}(t_{P2\Delta}) - i_{dc}(t_{P2Y})] - \frac{1}{T_r}\int_{t_{P2Y}}^{t_{P2\Delta}}[I_{d\_ref} - i_{dc}(t)]dt \right\}.$$

Equation (26) is the multivariate function of variables $K_r$, $T_r$, $t_{P2Y}$ and $t_{P2\Delta}$.

Further, combining equation (16), the partial derivative of $\varphi(K_r, T_r)$ with respect to parameter $K_r$ can be calculated:

$$\frac{\partial \varphi_{n+1}(K_r, T_r)}{\partial K_r} = \quad (27)$$

$$\frac{1}{\omega} \cdot \left\{ \begin{array}{l} [i_{dc}(t_{P2\Delta}) - i_{dc}(t_{P2Y})] + K_r \cdot \\ \left[\frac{di_{dc}(t_{P2\Delta})}{dt_{P2\Delta}} \cdot \frac{\partial t_{P2\Delta}}{\partial K_r} - \frac{di_{dc}(t_{P2Y})}{dt_{P2Y}} \cdot \frac{\partial t_{P2Y}}{\partial K_r}\right] \\ -\frac{1}{T}\left\{[I_{d\_ref} - i_{dc}(t_{P2\Delta})] \cdot \frac{\partial t_{P2\Delta}}{\partial K_r} - [I_{d\_ref} - i_{dc}(t_{P2Y})] \cdot \frac{\partial t_{P2Y}}{\partial K_r}\right\} \end{array} \right\}$$

By combining equations (14), (15), (19) and (20), the implicit functions of $t_{P2Y}$, $t_{P2\Delta}$, $K_r$ and $T_r$ can be obtained:

$$t_{P2Y} - \frac{1}{\omega} \cdot \{\pi - K_r[I_{d\_ref} - i_{dc}(t_{P2Y})]\} = 0 \quad (28)$$

$$t_{P2\Delta} - \quad (29)$$

$$\frac{1}{\omega} \cdot \left\{ 30° + \pi - K_r[I_{d\_ref} - i_{dc}(t_{P2\Delta})] - \frac{1}{T_r}\int_{t_{P2Y}}^{t_{P2\Delta}}[I_{d\_ref} - i_{dc}(t)]dt \right\} = 0$$

Denote the implicit function in equation (28) as $F(K_r, T_r, t_{P2Y}, t_{P2\Delta})$ and the implicit function in equation (29) as $G(K_r, T_r, t_{P2Y}, t_{P2\Delta})$. According to the implicit function theorem of multi-variable functions:

$$\frac{\partial t_{P2Y}}{\partial K_r} = -\frac{\begin{vmatrix} F_{Kr} & F_{tP2\Delta} \\ G_{Kr} & G_{tP2\Delta} \end{vmatrix}}{\begin{vmatrix} F_{tP2Y} & F_{tP2\Delta} \\ G_{tP2Y} & G_{tP2\Delta} \end{vmatrix}} = -\frac{I_{d\_ref} - i_{dc}(t_{P2Y})}{\omega - K_r \cdot \frac{di_{dc}(t_{P2Y})}{dt_{P2Y}}} \quad (30)$$

$$\frac{\partial t_{P2:\Delta}}{\partial K_r} = \quad (31)$$

$$-\frac{\begin{vmatrix} F_{tP2Y} & F_{Kr} \\ G_{tP2Y} & G_{Kr} \end{vmatrix}}{\begin{vmatrix} F_{tP2Y} & F_{tP2\Delta} \\ G_{tP2Y} & G_{tP2\Delta} \end{vmatrix}} = -\frac{\frac{1}{\omega}\left[1 - \frac{K_r}{\omega} \cdot \frac{di_{dc}(t_{P2Y})}{dt_{P2Y}}\right][I_{d\_ref} - i_{dc}(t_{P2\Delta})] + \frac{1}{\omega^2 T_r}[I_{d\_ref} - i_{dc}(t_{P2Y})]^2}{\left[1 - \frac{K_r}{\omega} \cdot \frac{di_{dc}(t_{P2Y})}{dt_{P2Y}}\right]\left\{1 - \frac{1}{\omega}\left\{K_r \frac{di_{dc}(t_{P2\Delta})}{dt_{P2\Delta}} - \frac{1}{T_r}[I_{d\_ref} - i_{dc}(t_{P2\Delta})]\right\}\right\}}$$

As can be seen from equations (26)-(31), control parameters $K_r$ and $T_r$ are transcendental equations of the implicit functions of $t_{P2\Delta}$ and $t_{P2Y}$. By calculating equations (24) and (25), the system of the solutions of $K_r$ and $T_r$ can be obtained:

$$(K_{r(i)}, T_{r(i)}) = \{(K_{r(1)}, T_{r(1)}), (K_{r(2)}, T_{r(2)}), \ldots, (K_{r(0)}, T_{r(0)})\} \quad (32)$$

By applying the elements in equation (32) to equation (21) and screening out the local minimum values of $W_\Sigma$, the solution system of local minimum values $W_{im\Sigma}$ can be established:

$$W_{im\Sigma} = \{W_{1m\Sigma}|_{(K_{r(1)}, T_{r(1)})}, W_{im\Sigma}|_{(K_{r(2)}, T_{r(2)})}, \ldots, W_{nm\Sigma}|_{(K_{r(n)}, T_{r(n)})}\} \quad (33)$$

After the control parameters are optimized, the cumulative value of dissipated energy of the system $W_{i\Sigma}$ should satisfy:

$$W_{i\Sigma} < W_{0\Sigma} \quad (34)$$

Where, $W_{0\Sigma}$ is the accumulated energy of the system without parameter optimization. By combining equations (33) and (34), the system of solutions that satisfy the optimization conditions can be further screened:

$$W_{i\Sigma} = \{W_{1\Sigma}|_{(K_{r(1)}, T_{r(1)})}, W_{i\Sigma}|_{(K_{r(2)}, T_{r(2)})}, \ldots, W_{n\Sigma}|_{(K_{r(n)}, T_{r(n)})}\} \quad (35)$$

Then, the values of $K_r$ and $T_r$ corresponding to the local minimum values in $W_{i\Sigma}$ (denoted as $W_{i\Sigma min}$) are selected as the optimal control parameters, which can minimize the impact exerted on the system during fault recovery.

Embodiment 2

Figure 7:
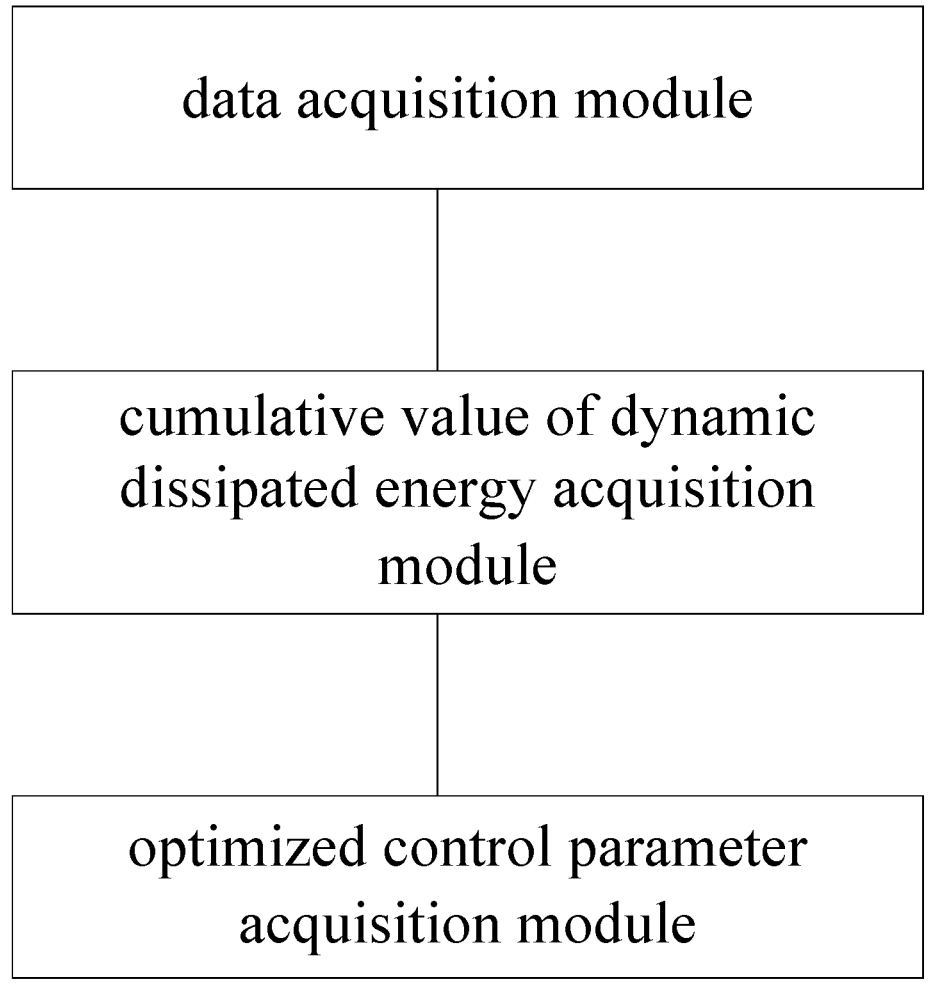
FIG. 7 is the structure schematic diagram of the fault transient features optimization system of AC/DC systems based on dissipated energy.

Embodiment 2 of the invention discloses a fault transient features optimization system of AC/DC system based on dissipated energy. As shown in FIG. 7, the system including:

A data acquisition module is configured to obtain the output current and outlet bus voltage of the generator during the whole process of fault recovery of the AC/DC system under the current set of control parameters when every time adjusting the control parameters of the rectifier, and obtain multiple sets of control parameters and their corresponding output current and outlet bus voltage of the generator during the whole process of fault recovery of the AC/DC systems;

A cumulative value of dynamic dissipated energy acquisition module is used to, for each set of control parameters, calculate cumulative the value of dynamic dissipated energy of the generator under the set of control parameters based on the output current and outlet bus voltage of the generator during the whole process of dc system fault recovery under the set of control parameters.

An optimized control parameter acquisition module is used to select the set of control parameters that minimizes the cumulative value of dynamic dissipated energy of the generator as optimal control parameters in the process of fault transient features optimization.

The specific implementation process of the second embodiment of the invention can be referred to the above embodiment of the method, and this embodiment is not repeated here.

As the principle of this embodiment is the same as that of the above embodiment of the method, the system also has the corresponding technical effect of the above embodiment of the method.

Embodiment 3

Figure 8A:
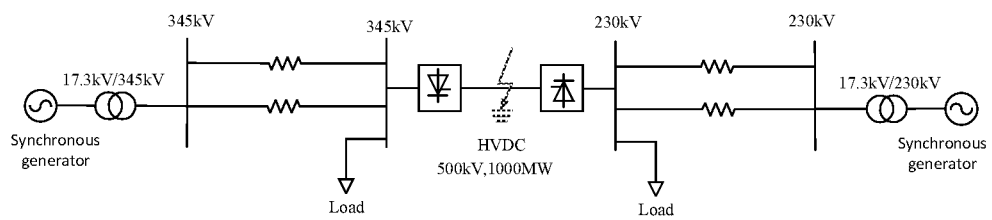
FIG. 8A is the simulation system structure diagram.
Figure 8B:
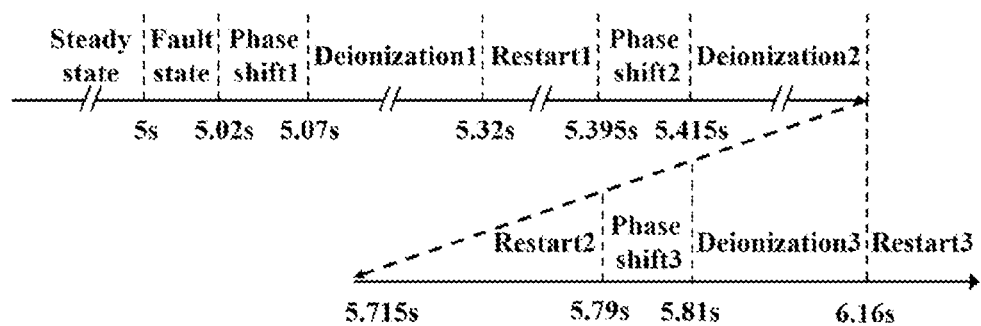
FIG. 8B is the sequence diagram of the fault recovery process of the rectifier.

Take Cigre_Benchmark AC/DC transmission system as shown in FIG. 8(a). The system DC voltage is 500 kV, the rated DC current is 2 kA, the DC transmission power is 1000 MV, and the effective value of AC side voltage is 220 kV.

After the fault occurs, the system enters the first phase shilling stage at t=5.02 s. After the phase shifting, the system enters the deionization stage at 5.07 s. After deionization is completed, the system tries to restart for the first time at t=5.32 s. Because the fault is not cleared at this time, the system enters the second "phase shifting-deionization" at t=5.395 s after the restart failure, and tries the second restart at t=5.715 s. However, the fault is still not cleared at this time, so the system enters the third "phase shifting-deionization" and tries to restart again at t=6.16 s. The fault is rectified and the system restarts successfully for the third time.

Calculate the cumulative value of dynamic dissipated energy of the system. The system tries to restart for the first time at t=5.32 s. At this time, the restart fails because the line fault is not cleared. During this period, the restart on fault will generate high pulsed current in the DC system; and the higher the amplitude of the pulsed current the higher the threat to system stability and device security. By substituting the control parameters in Table 1 into the system, the DC current waveform under different parameters when the fault restarts can be obtained, as shown in FIG. 9.

Figure 9:
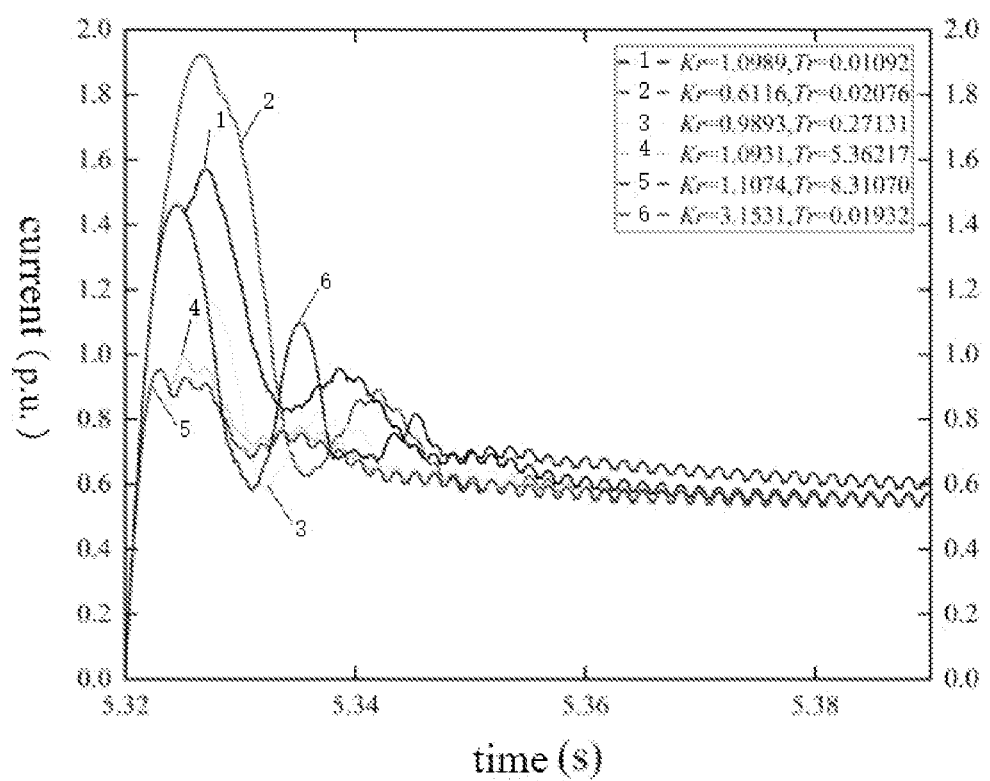
FIG. 9 is the DC pulsed current during the first restart on fault.

As can be seen from FIG. 9, the peak values of the restart DC pulsed current corresponding to different control parameters are very different. The comparison result is shown in table 1.

TABLE 1

Comparison of DC current under different control parameters

| Serial number | Control parameters | $i_{pi1}$ (p.u.) | Decline (%) |
|---|---|---|---|
| 0 | $K_r = 1.0989$, $T_r = 0.01092$ | 1.57556 | 0 |
| 1 | $K_r = 0.6116$, $T_r = 0.02076$ | 1.92145 | −21.95 |
| 2 | $K_r = 0.9893$, $T_r = 0.27131$ | 1.46074 | 7.29 |
| 3 | $K_r = 1.0931$, $T_r = 5.36217$ | 0.98732 | 37.34 |
| 4 | $K_r = 1.1074$, $T_r = 8.31070$ | 0.95185 | 39.59 |
| 5 | $K_r = 3.1531$, $T_r = 0.01932$ | 1.14153 | 7.28 |

According to table 1, when the control parameters adopt the standard values, the peak value of the restart DC pulsed current reaches as high as 1.57556 p.u. When the control parameters are adjusted to the optimal values ($K_r=1.1074$, $T_r$=8.31070), the peak value of the restart DC pulsed current decreases significantly (by 39.59%) to 0.95185 p.u.

At the same time, the transient power angle of the generator will also swing due to the high restart DC pulsed current. The larger the peak-valley difference in the swing curve of the power angle is, the more seriously the generator is disturbed, and the worse it is for the safe and stable operation of the system. After regulating the control parameters, the variation curves of the generator power angle during the $1^{st}$ 'restart at fault' are shown in FIG. 10.

Figure 10:
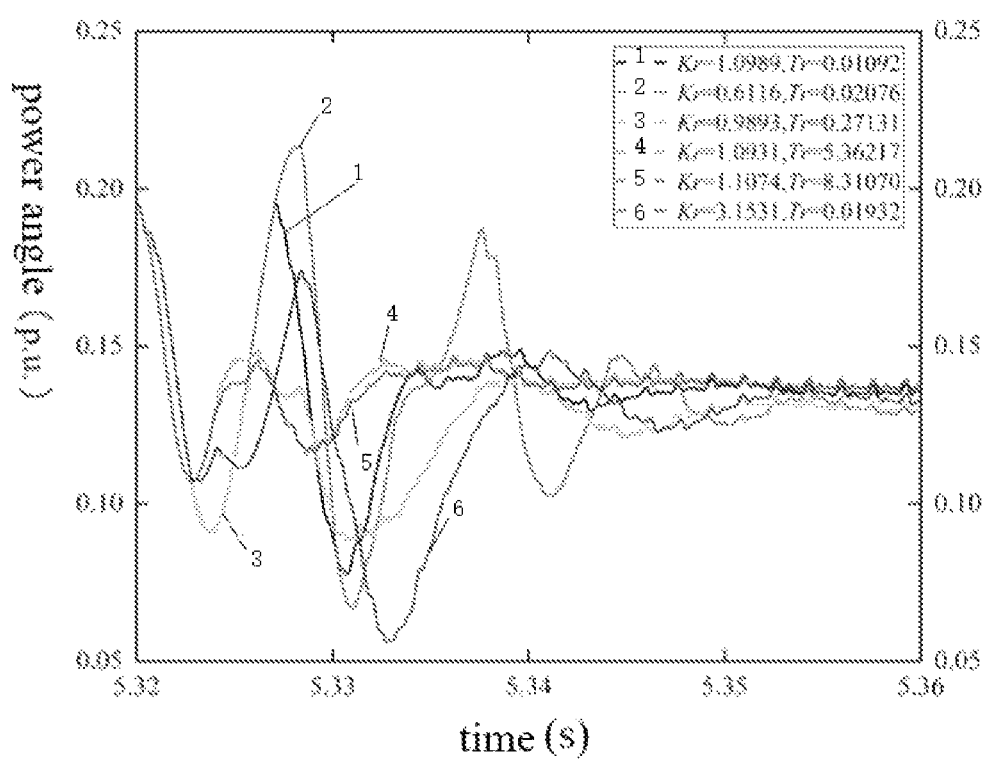
FIG. 10 is the generator power angle during the first restart on fault.

According to FIG. 10, the regulation of the control parameters obviously changes the variation curve of the generator power angle. Comparison between the peak-valley differences in the swing curves of generator power angle under different control parameters is shown in table 2.

TABLE 2

Comparison of generator power angle swing with different control parameters (the first restart failed)

| Serial number | Control parameters | Power angle peak valley difference (p.u.) | Decline (%) |
|---|---|---|---|
| 0 | $K_r$ = 1.0989, $T_r$ = 0.01092 | 0.1180 | 0 |
| 1 | $K_r$ = 0.6116, $T_r$ = 0.02076 | 0.1463 | −23.98 |
| 2 | $K_r$ = 0.9893, $T_r$ = 0.27131 | 0.0575 | 51.27 |
| 3 | $K_r$ = 1.0931, $T_r$ = 5.36217 | 0.0332 | 71.86 |
| 4 | $K_r$ = 1.1074, $T_r$ = 8 31070 | 0.0294 | 75.08 |
| 5 | $K_r$ = 3.1531, $T_r$ = 0.01932 | 0.1168 | 1.02 |

According to Table 2, when the control parameters are not regulated, the generator power angle swings violently, with the peak-valley difference reaching as high as 0.1180 p.u. When the control parameters are adjusted to the optimal values ($K_r$=1.1074, $T_r$=8.31070), the swing of generator power angle obviously softens. The peak-valley difference of the power angle decreases (by 75.08%) to 0.0294 p.u.

Figure 11:
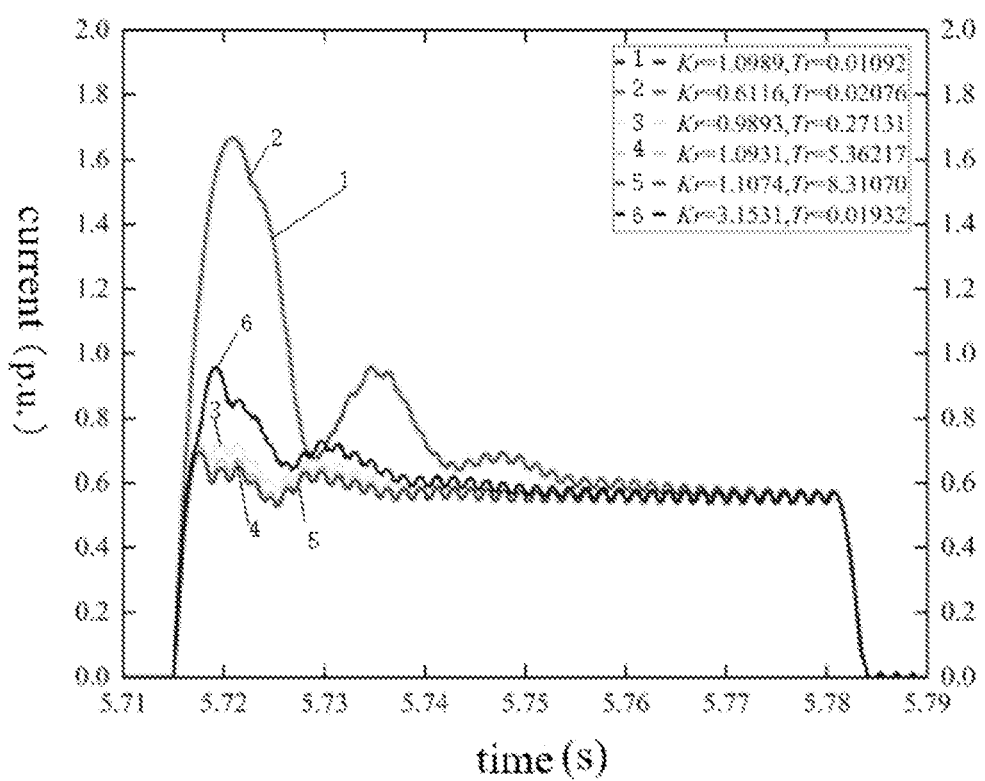
FIG. 11 is the DC pulsed current during the second restart on fault.

After the $1^{st}$ restart fails, the system tries the $2^{nd}$ restart at t=5.715 s after the $2^{nd}$ 'phase shifting-deionization' process. The $2^{nd}$ restart still fails because the fault is still not cleared. During the $2^{nd}$ restart failure, the waveforms of the restart DC pulsed current under different parameter settings are shown in FIG. 11, and the comparison between the peaks values of the DC pulsed current is shown in table 3.

TABLE 3

Comparison of DC pulsed current under different control parameters (the second restart fails)

| Serial number | Control parameters | $i_{pi2}$ (p.u.) | Decline (%) |
|---|---|---|---|
| 0 | $K_r$ = 1.0989, $T_r$ = 0.01092 | 1.66574 | 0 |
| 1 | $K_r$ = 0.6116, $T_r$ = 0.02076 | 1.66778 | −0.001 |
| 2 | $K_r$ = 0.9893, $T_r$ = 0.27131 | 0.73041 | 56.15 |
| 3 | $K_r$ = 1.0931, $T_r$ = 5.36217 | 0.71203 | 57.25 |
| 4 | $K_r$ = 1.1074, $T_r$ = 8.31070 | 0.69492 | 58.28 |
| 5 | $K_r$ = 3.1531, $T_r$ = 0.01932 | 0.95683 | 42.56 |

As can be seen from FIG. 11 and Table 3, when the parameters are not optimized, the peak value of the restart DC pulsed current during the $2^{nd}$ 'restart at fault' $i_{p12}$ reaches 1.66574 p.u., even higher than the peak value during the $1^{st}$ 'restart at fault $i_{p11}$=1.57556 p.u. Thus the $2^{nd}$ 'restart at fault' will exert even more intense impact on the system, seriously intimidating the safe and stable operation of the system. When the control parameters are regulated to the optimal values ($K_r$=1.1074, $T_r$=8.31070), $i_{p12}$ drops substantially (by 58.28%) to 0.69492 p.u. Thus, the second impact on the system is significantly reduced.

Figure 12:
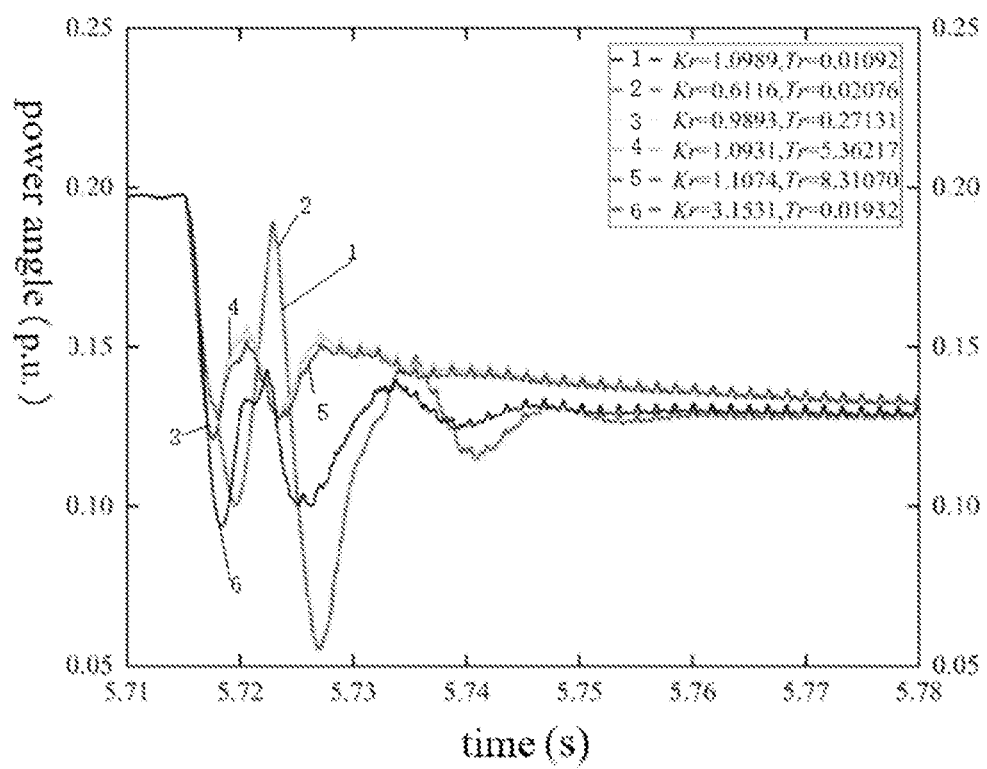
FIG. 12 is the generator power angle during the second restart on fault.

During the $2^{nd}$ 'restart at fault', the variation curves of the generator power angle under different control parameters are shown in FIG. 12, and the peak-valley differences of the power angle are shown in table 4.

TABLE 4

Comparison of generator power Angle swing with different control parameters

| Serial number | Control parameters | Power angle peak valley difference (p.u.) | Decline (%) |
|---|---|---|---|
| 0 | $K_r$ = 1.0989, $T_r$ = 0.01092 | 0.1346 | 0 |
| 1 | $K_r$ = 0.6116, $T_r$ = 0.02076 | 0.1348 | −0.001 |
| 2 | $K_r$ = 0.9893, $T_r$ = 0.27131 | 0.0272 | 79.79 |
| 3 | $K_r$ = 1.0931, $T_r$ = 5.36217 | 0.0272 | 79.79 |
| 4 | $K_r$ = 1.1074, $T_r$ = 8.31070 | 0.0245 | 81.80 |
| 5 | $K_r$ = 3.1531$T_r$ = 0.01932 | 0.0438 | 67.46 |

According to FIG. 12 and Table 4, when the control parameters are not regulated, the peak-valley difference of the generator power angle reaches 0.1346 p.u. But when the control parameters are set at the optimal values ($K_r$=1.1074, $T_r$=8.31070), the peak-valley difference decreases (by 81.80%) to as low as 0.0245 p.u.

The person skilled in the art can understand that all or part of the process of realizing the above embodiments can be completed by instructing the relevant hardware through a computer program, and the program can be stored in a computer readable storage medium. Wherein, the computer readable storage medium for disk, optical disk, read-only storage memory or random storage memory.

The above is only a better specific implementation of the invention, but the protection scope of the invention is not limited to this, any change or replacement that can be easily thought of by a technical personnel familiar with the technical field within the scope of the technology disclosed by the invention shall be covered by the protection scope of the invention.

What is claimed is:

1. A fault transient features optimization method of AC/DC system based on dissipated energy, wherein, the method comprising following steps:
   obtaining an output current and outlet bus voltage of a generator during a whole process of fault recovery of the AC/DC system under current set of control parameters when adjusting the control parameters of a rectifier, and obtain multiple sets of control parameters and their corresponding output current and outlet bus voltage of the generator during the whole process of fault recovery of the AC/DC system;
   for each set of control parameters, calculating cumulative value of dynamic dissipated energy of the generator under the set of control parameters based on the output current and outlet bus voltage of the generator during whole process of DC system fault recovery under the set of control parameters;
   selecting the set of control parameters that minimizes the cumulative value of dynamic dissipated energy of the generator as optimal control parameters in the process of fault transient features optimization.

2. The fault transient features optimization method of AC/DC system according to claim 1, wherein, the accumulative value of dynamic dissipated energy of the generator under the set of control parameters can be obtained by performing following operations:

obtaining every commutation interval of Y/D bridge of inverter in the whole process of AC/DC system fault recovery under the set of control parameters;

separately calculating the dynamic dissipated energy of the generator in each commutation interval;

accumulating the dynamic dissipated energy of the generator in all commutation intervals and obtaining the cumulative value of dynamic dissipated energy of the generator under the set of control parameters.

3. The fault transient features optimization method of AC/DC system based on dissipated energy according to claim 1, wherein, the rectifier adopts a constant current control mode.

4. The fault transient features optimization method of AC/DC system based on dissipated energy according to claim 3, wherein, the accumulative value of dynamic dissipated energy of generator $W_\Sigma$ is:

$$W_\Sigma = \Sigma W_{G(n)}(K_r, T_r, t_{P2Y}, t_{P2\Delta}) \quad (1)$$

where, $W_{G(n)}$ represents the dynamic dissipated energy of the generator in the $n_{th}$ commutation interval; $K_r$, $T_r$ is the control parameter of the rectifier in constant current control mode, where $K_r$ is proportional coefficient of PI unit, $T_r$ is time constant of PI unit; $t_{P2Y}$ and $t_{P2\Delta}$ respectively represent start time and end time of the commutation interval of Y/D bridge of inverter.

5. The fault transient features optimization method of AC/DC system based on dissipated energy according to claim 4, wherein, the dynamic dissipated energy of the generator $W_G$ is:

$$W_G = \int i_{dG} du_{qG} - \int i_{qG} du_{dG} + \int (u_{dG} i_{dG} + u_{qG} i_{qG}) d\theta \quad (2)$$

where, $i_{dG}$ and $i_{qG}$ respectively represent components of the output current of the generator in axis d and axis q; $u_{dG}$ and $u_{qG}$ respectively represent components of generator outlet bus voltage on axis d and q, and $\theta$ is the angle between axis q and axis x.

6. A fault transient features optimization system of AC/DC system based on dissipated energy, wherein, the system comprising:

A data acquisition module is configured to obtain the output current and outlet bus voltage of the generator during the whole process of fault recovery of the AC/DC system under the current set of control parameters when adjusting the control parameters of the rectifier, and obtain multiple sets of control parameters and their corresponding output current and outlet bus voltage of the generator during the whole process of fault recovery of the AC/DC systems;

a cumulative value of dynamic dissipated energy acquisition module is configured to, for each set of control parameters, calculate cumulative value of dynamic dissipated energy of the generator under the set of control parameters based on the output current and outlet bus voltage of the generator during whole process of DC system fault recovery under the set of control parameters;

an optimized control parameter acquisition module is configured to select the set of control parameters that minimizes the cumulative value of dynamic dissipated energy of the generator as optimal control parameters in the process of fault transient features optimization.

7. The fault transient features optimization system of AC/DC system based on dissipated energy mentioned according to claim 6, wherein, the cumulative value of the dynamic dissipated energy of the generator under the set of control parameters is obtained by performing the following operations:

obtaining every commutation interval of Y/D bridge of inverter in the whole process of AC/DC system fault recovery under the set of control parameters;

separately calculating the dynamic dissipated energy of the generator in each commutation interval;

accumulating the dynamic dissipated energy of the generator in all commutation intervals and obtain the cumulative value of dynamic dissipated energy of the generator under the set of control parameters.

8. The fault transient features optimization system of AC/DC system based on dissipated energy according to claim 6, wherein, the rectifier adopts a constant current control mode.

9. The fault transient fault features optimization system of AC/DC system based on dissipated energy according to claim 8, wherein, the cumulative value of dynamic dissipated energy of the generator $W_\Sigma$ is:

$$W_\Sigma = \Sigma W_{G(n)}(K_r, T_r, t_{P2\Delta}) \quad (3)$$

where, $W_{G(n)}$ represents the dynamic dissipated energy of the generator in the $n_{th}$ commutation interval; $K_r$, $T_r$ are the control parameters of the rectifier in constant current control mode, where $K_r$ is proportional coefficient of PI unit, $T_r$ is the time constant of PI unit; $t_{P2Y}$ and $t_{P2\Delta}$ respectively represent start time and end time of the commutation interval of Y/D bridge of inverter.

10. The fault transient features optimization system of AC/DC system based on dissipated energy according to claim 9, wherein, the dynamic dissipated energy of the generator $W_G$ is:

$$W_G = \int i_{dG} du_{qG} - \int i_{qG} du_{dG} + \int (u_{dG} i_{dG} + u_{qG} i_{qG}) d\theta \quad (4)$$

where, $i_{dG}$ and $i_{qG}$ respectively represent components of the output current of the generator in axis d and axis q; $u_{dG}$ and $u_{qG}$ respectively represent components of generator outlet bus voltage on axis d and q, $\theta$ is the angle between axis q and axis x.

* * * * *